United States Patent [19]

Kokado

[11] Patent Number: 5,072,274
[45] Date of Patent: Dec. 10, 1991

[54] SEMICONDUCTOR INTEGRATED CIRCUIT HAVING INTERCONNECTION WITH IMPROVED DESIGN FLEXIBILITY

[75] Inventor: Masayuki Kokado, Machida, Japan

[73] Assignee: Fujitsu Limited, Kawasaki, Japan

[21] Appl. No.: 624,467

[22] Filed: Dec. 10, 1990

Related U.S. Application Data

[63] Continuation of Ser. No. 243,745, Sep. 13, 1988, abandoned.

[30] Foreign Application Priority Data

Sep. 14, 1987 [JP] Japan .................. 62-230258

[51] Int. Cl.$^5$ ............................................ H01L 27/02
[52] U.S. Cl. .......................................... 357/41; 357/43; 357/40; 357/59; 357/49
[58] Field of Search ............... 357/41, 43, 34, 49, 357/59 K, 65, 47, 40; 437/79

[56] References Cited

U.S. PATENT DOCUMENTS

| | | | |
|---|---|---|---|
| 4,151,541 | 4/1979 | Roger | 357/34 |
| 4,266,238 | 5/1981 | Nishizawa | 357/46 |
| 4,277,794 | 7/1981 | Nuzillat | 357/34 |
| 4,511,220 | 9/1986 | MacIver | 357/41 |
| 4,661,202 | 4/1987 | Ochii | 357/59 K |
| 4,819,052 | 4/1989 | Hutter | 357/49 |
| 4,879,584 | 11/1989 | Takagi et al. | 357/43 |
| 4,884,117 | 11/1989 | Neppl et al. | 357/49 |

FOREIGN PATENT DOCUMENTS

| | | | |
|---|---|---|---|
| 1552459 | 1/1969 | France . | |
| 2464562 | 3/1981 | France . | |
| 0124153 | 7/1984 | Japan | 357/43 |
| 493097 | 6/1970 | Switzerland . | |

*Primary Examiner*—William Mintel
*Assistant Examiner*—Minhloan Tran
*Attorney, Agent, or Firm*—Armstrong, Nikaido, Marmelstein, Kubovcik & Murray

[57] ABSTRACT

A semiconductor integrated circuit is supplied with a power source voltage to a circuit element forming layer thereof from a conductive layer through a substrate and a certain region made of a semiconductor type identical to that of the substrate. The conductive layer is formed on a back surface of the substrate, and the certain region makes contact with a front surface of the substrate. The circuit element forming layer is provided on the front surface side of the substrate and connects to the certain region. Alternatively, a region may be provided to extend from the circuit element forming layer to the substrate so as to provide a conductive path for supplying the power source voltage from the back surface of the substrate.

16 Claims, 10 Drawing Sheets

SEMICONDUCTOR INTEGRATED CIRCUIT HAVING INTERCONNECTION WITH IMPROVED DESIGN FLEXIBILITY

This application is a continuation of application Ser. No. 243,745, filed Sept. 13, 1988, now abandoned.

BACKGROUND OF THE INVENTION

The present invention generally relates to semiconductor integrated circuits, and more particularly to a bipolar semiconductor integrated circuit.

The integration density of semiconductor integrated circuits is rapidly improving due to the progress in lithography techniques and the like. Hence, the number of signal interconnections within the integrated circuit is increasing, and a region for providing power source interconnections for supplying power source voltages is increasing because of the increase in the power consumption of the integrated circuit. Especially in the case of a bipolar integrated circuit, it is impossible to reduce the current consumption of each circuit below a predetermined value in order to maintain the high-speed operation of each circuit.

In addition, the number of multi-level interconnections is limited to approximately three because deficiencies such as a disconnection and inconsistent thickness of the interconnection are easily generated when four or more levels of interconnections are stacked. Consequently, the chip size becomes large because of the need to increase the signal interconnections in each level and to widen the power source interconnections. Hence, there is a demand to prevent such an increase of the chip size. On the other hand, when the length of the signal interconnection is long, it is impossible to realize a high-speed circuit operation even when high-speed circuit elements are used.

FIGS. 1A and 1B are a plan view and a cross sectional view respectively showing an example of a conventional semiconductor integrated circuit In FIGS. 1A and 1B, a semiconductor chip 12 is accommodated within a stage 11 of a package 10. Terminals 13 for signal input and output and terminals 14 for supplying power source voltages $V_{CC}$ and $V_{EE}$ are provided on the semiconductor chip 12, and these terminals 13 and 14 are wire-bonded on package leads 15.

A first power source interconnection (not shown) for the power source voltage $V_{CC}$ and a second power source interconnection 16 for the power source voltage $V_{EE}$ are provided on the semiconductor chip 12. The first and second power source interconnections respectively have stripe patterns which intersect each other in the plan view. For example, an emitter coupled logic (ECL) circuit is formed between the first and second power source interconnections.

FIG. 2 shows a cross sectional view of the semiconductor chip 12. As shown in FIG. 2, the semiconductor chip 12 has a $p^-$-type substrate 21 provided with a metallized layer 20 on a back surface thereof. An $n^+$-type buried layer 22, an n-type epitaxial layer 23, a $p^+$-type isolation layer 24, a p-type diffusion layer 25 which becomes a base, an $n^+$-type diffusion layer 26 which becomes an emitter, an $n^+$-type diffusion layer 27 which becomes a collector, and a p-type diffusion layer 28 which becomes a resistor are provided on a front surface of the $p^-$-type substrate 21. In addition, the semiconductor chip 12 has insulator layers 29 and 30 indicated by hatchings, a first interconnection 31, and a second interconnection 32. For example, the second interconnection 32 corresponds to the second power source interconnection 16 for the power source voltage $V_{EE}$ shown in FIGS. 1A and 1B.

When considering an integrated circuit with 1000 gates where the current consumption is 1 mA per gate, for example, a current of 1 A flows in total. When the power source interconnection is an aluminum interconnection having a current density of $2 \times 10^5$ A/cm$^2$ and a thickness of 1 micron, the power source interconnection needs a large width of 0.5 mm. In addition, there are problems in that a voltage drop caused by the large current flow is large in the power source interconnection having the stripe pattern and that the noise margin of the circuit is poor.

Because of the need to reduce the capacitance between the collector and the substrate, that is, mainly the capacitance introduced between the $n^+$-type buried layer 22 and the substrate 21, the substrate 21 has a low impurity density with a high resistivity in the range of 5 Ωcm to 30 Ωcm. Normally, the substrate 21 has a thickness of 500 microns, and for this reason, it is impossible to supply the power source voltage from the back surface of the substrate 21 when the voltage drop is taken into account. Thus, the first and second interconnections 31 and 32 are used to supply the power source voltages.

Therefore, the conventional semiconductor integrated circuit suffers problems in that the voltage drop is large due to the long power source interconnections, and the freedom with which the signal interconnections may be designed is limited because the signal interconnections must be positioned avoiding the power source interconnections. In other words, the design flexibility of the interconnection is poor in the conventional integrated circuit. Furthermore, there is another problem in that the chip size becomes large because of the need to provide a large number of terminals for the power source voltages on the semiconductor chip.

SUMMARY OF THE INVENTION

Accordingly, it is a general object of the present invention to provide a novel and useful semiconductor integrated circuit in which the problems described above are eliminated.

Another and more specific object of the present invention is to provide a semiconductor integrated circuit in which a power source voltage is supplied to a circuit element forming layer from a conductive layer through a substrate and a certain region made of a semiconductor type identical to that of the substrate or through the substrate and a certain region made of a metal material. The conductive layer is formed on one side of the substrate, and the certain region makes contact with the other side of the substrate. The circuit element forming layer is provided on the other side of the substrate and connects to the certain region. According to the semiconductor integrated circuit of the present invention, it is possible to shorten the length of a power source interconnection and a voltage drop is effectively reduced thereby. In addition, it is possible to reduce the power source interconnections on the surface of a semiconductor chip. As a result, signal interconnections may be designed with a large degree of freedom and it is possible to prevent the chip size from increasing.

Still another object of the present invention is to provide a semiconductor integrated circuit comprising a substrate of a first semiconductor type having a first impurity density, where the first semiconductor type is one of p-type and n-type semiconductors, a conductive layer formed on a back surface of the substrate, a first layer of the first semiconductor type formed on a front surface of the substrate and having a second impurity density lower than the first impurity density, a second layer of a second semiconductor type formed on the first layer for forming circuit elements therein, where the second semiconductor type is the other of the p-type and n-type semiconductors, and a region of the first semiconductor type extending from a top surface of the second layer and reaching at least the first layer. The conductive layer, the first layer and the region form a conductive path for supplying a power source voltage to the circuit elements in the second layer from the back surface of the substrate. According to the semiconductor integrated circuit of the present invention, the length of the power source interconnection is shortened and the voltage drop can be decreased compared to the conventional semiconductor integrated circuit. In addition, the noise margin is improved and it is possible to realize a high-speed circuit operation. Moreover, because the conductor path for supplying the power source voltage is arranged vertically on the substrate, the signal interconnections can be designed with a large degree of freedom thereby making it possible to prevent the chip size from increasing.

Other objects and further features of the present invention will be apparent from the following detailed description when read in conjunction with the accompanying drawings.

DETAILED DESCRIPTION

Figure 3:
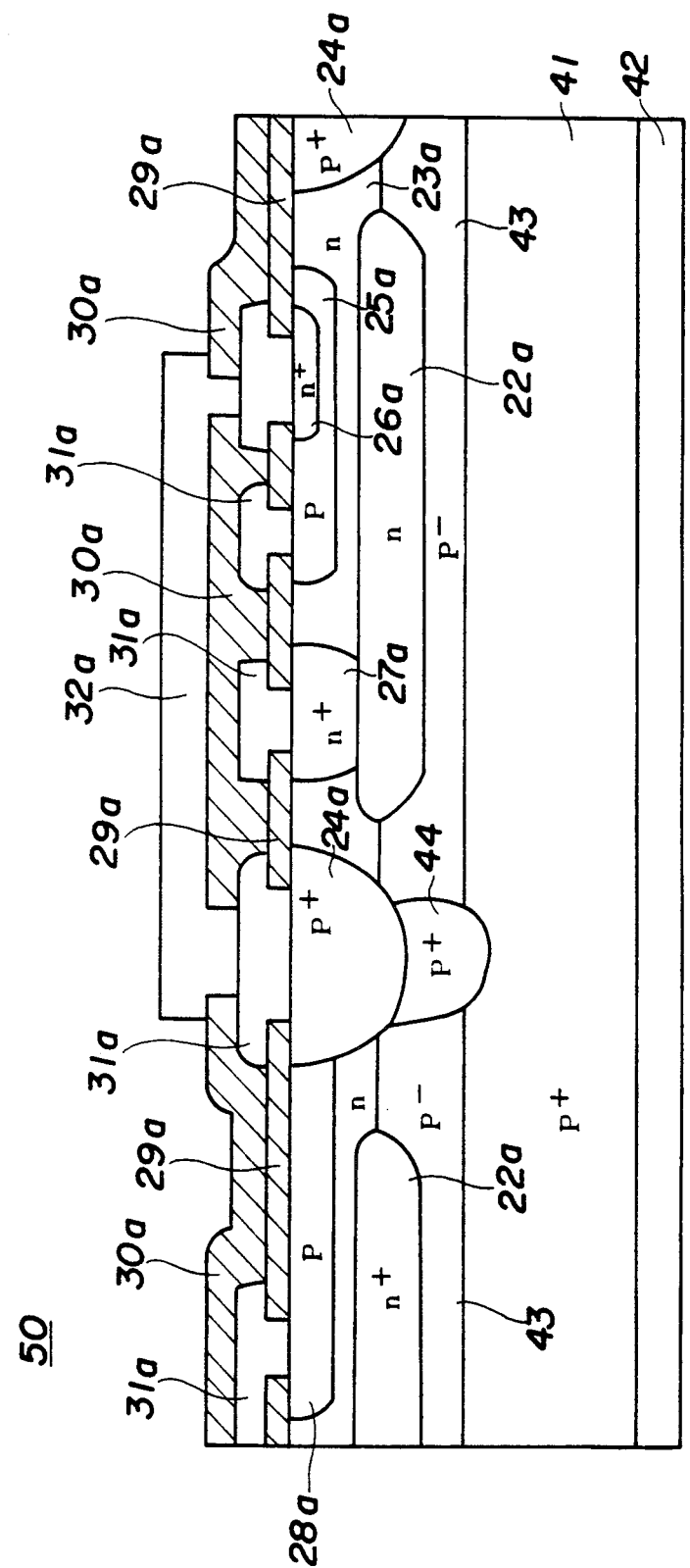
FIG. 3 is a cross sectional view showing a semiconductor chip of a first embodiment of a semiconductor integrated circuit according to the present invention.

FIG. 3 is a cross sectional view showing a semiconductor chip of a first embodiment of a semiconductor integrated circuit according to the present invention. In FIG. 3, a $p^+$-type substrate 41 of a semiconductor chip 50 has a high impurity density with a resistivity of 0.1 $\Omega$cm or less. A metallized layer (conductive layer) 42 is provided on a back surface of the $p^+$-type substrate 41. A $p^-$-type epitaxial layer (first p-type layer) 43 having a high resistivity in the range of 1 $\Omega$cm to 30 $\Omega$cm is formed on a front surface of the $p^+$-type substrate 41. A $p^+$-type layer (second p-type layer) or region 44 having a low resistivity is selectively formed within the $p^-$-type epitaxial layer 43.

Figure 1A:
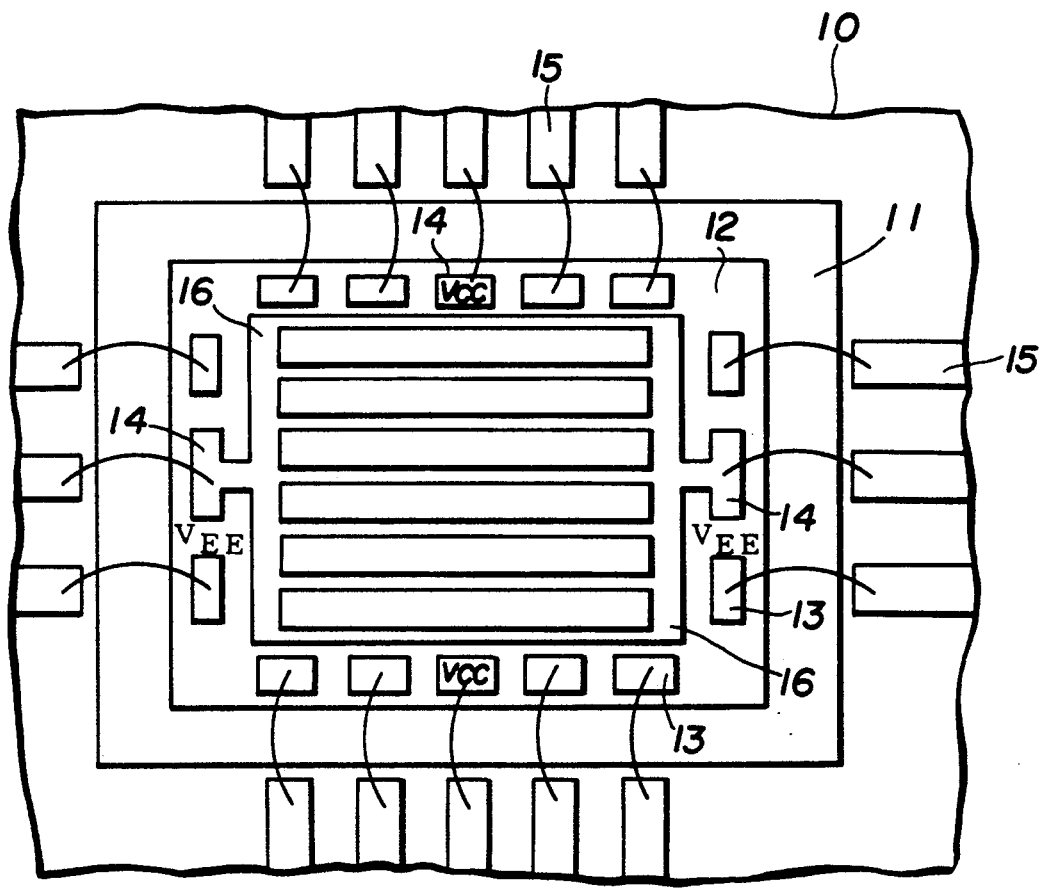
FIGS. 1A and 1B are a plan view and a cross sectional view respectively showing an example of a conventional semiconductor integrated circuit.
Figure 1B:
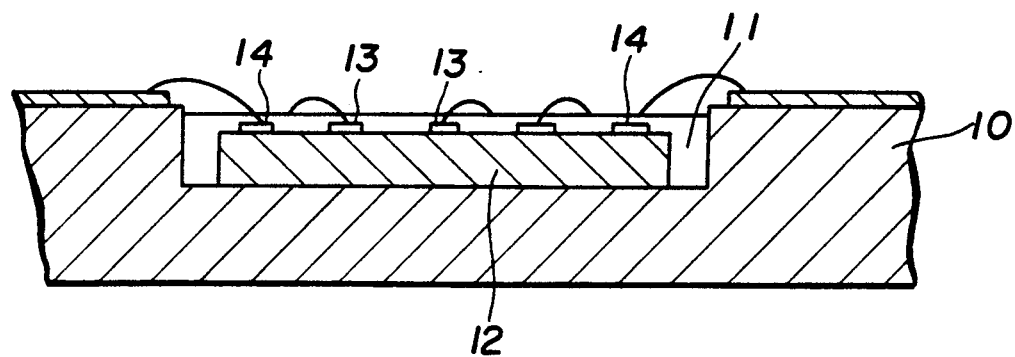
Figure 2:
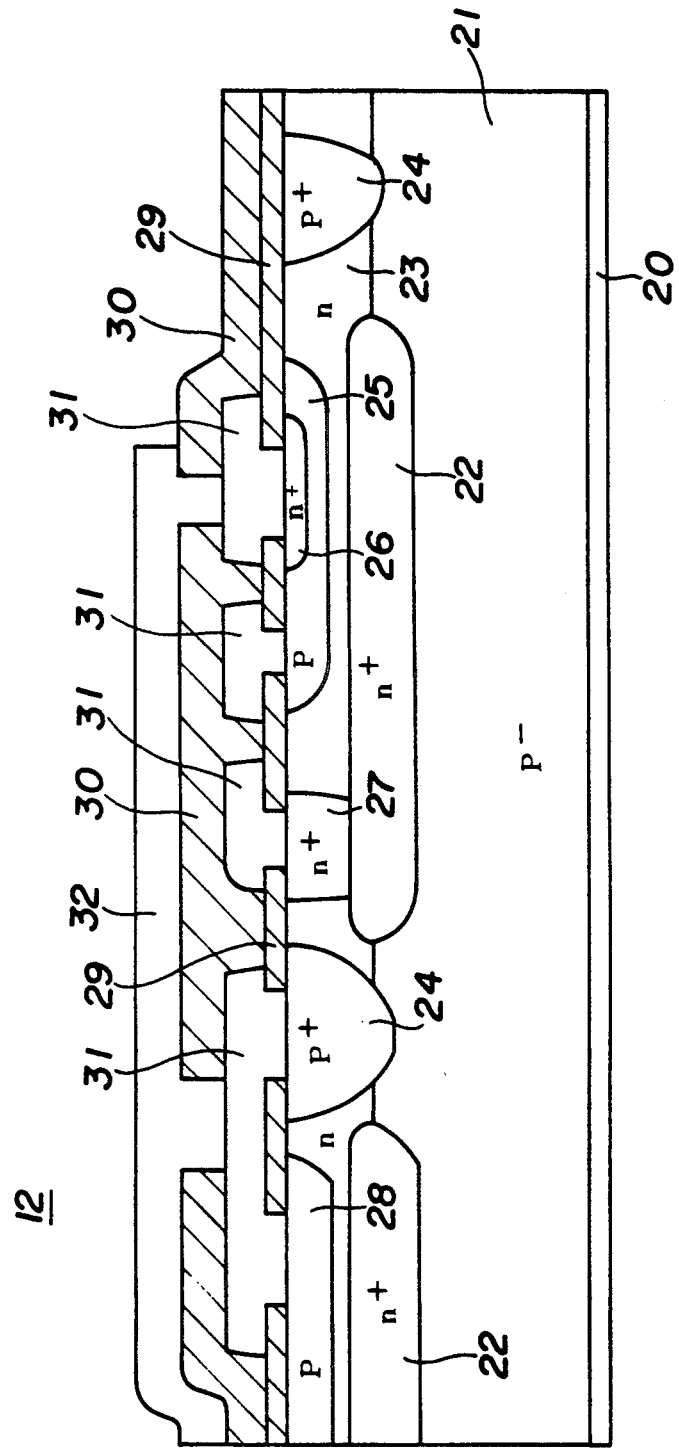
FIG. 2 is a cross sectional view of a semiconductor chip shown in FIGS. 1A and 1B.

Similarly as in the case of the conventional semiconductor chip shown in FIG. 2 described before, an $n^+$-type buried layer 22a, an n-type epitaxial layer 23a, a $p^+$-type isolation layer or region 24a, a p-type diffusion layer 25a which becomes a base, an $n^+$-type diffusion layer 26a which becomes an emitter, an $n^+$-type diffusion layer 27a which becomes a collector, and a p-type diffusion layer 28a which becomes a resistor are provided on the front surface of the $p^+$-type substrate 41. In addition, the semiconductor chip 50 has insulator layers 29a and 30a indicated by hatchings, a first interconnection 31a, and a second interconnection 32a.

Hence, a conductor path is formed from the metallized layer 42 to the first and second interconnections 31a and 32a through the $p^+$-type substrate 41 having the low resistivity, the $p^+$-type layer 44 and the $p^+$-type isolation layer 24a. The second interconnection 32a is connected to transistors and resistor elements formed on the substrate surface.

Figure 4:
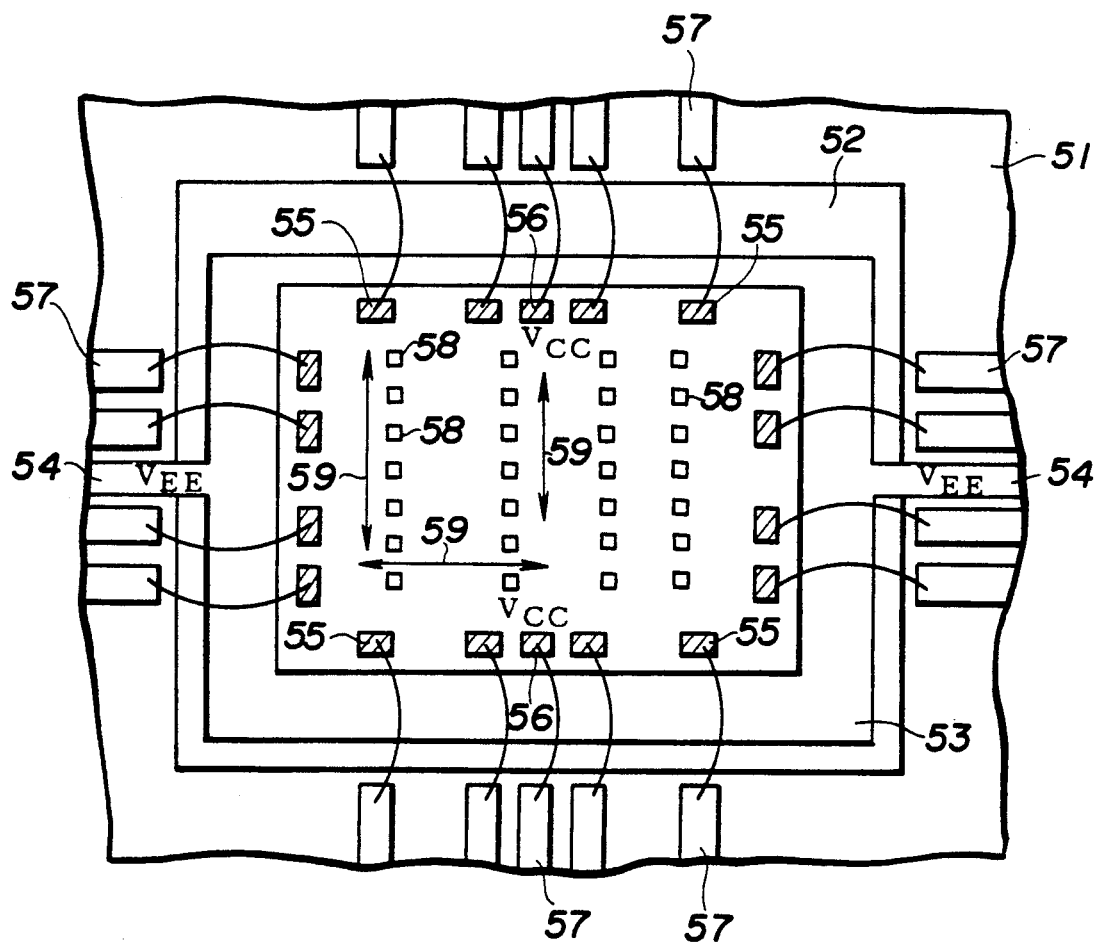
FIGS. 4A and 4B are a plan view and a cross sectional view respectively showing the first embodiment of the semiconductor integrated circuit according to the present invention.
Figure 4:
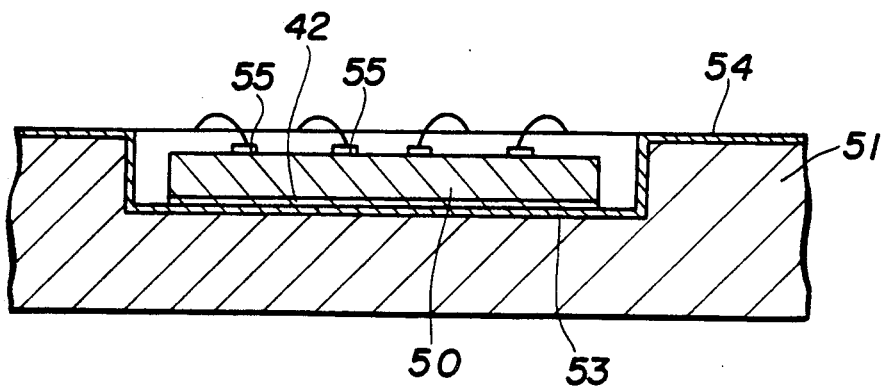

The semiconductor chip 50 having the structure shown in FIG. 3 is accommodated within a stage 52 of a package 51 as shown in FIGS. 4A and 4B. FIGS. 4A and 4B are a plan view and a cross sectional view respectively showing the first embodiment of a semiconductor integrated circuit according to the present invention.

In FIGS. 4A and 4B, a metallized layer 53 is provided on approximately the entire surface of the stage 52 of the package 51. The metallized layer 53 is connected to package leads 54 for the power source voltage $V_{EE}$. The semiconductor chip 50 is connected to the package 51 with the metallized layer 42 of the semiconductor chip 50 in contact with the metallized layer 53 of the package 51. Terminals 55 for signal input and output and terminals 56 for supplying the power source voltage $V_{CC}$ are provided on the semiconductor chip 50, and these terminals 55 and 56 are connected to package leads 57 by wire-bonding or the like.

Accordingly, the power source voltage $V_{EE}$ is supplied to the semiconductor chip 50 through the package lead 54 and the metallized layer 53, and the power source voltage $V_{EE}$ is passed through the $p^+$-type substrate 41, the $p^+$-type layer 44 and the $p^+$-type isolation layer 24a. Finally, the power source voltage $V_{EE}$ obtained through these layers is supplied to the ECL circuit or the like within the semiconductor chip 50 through the first and second supplying the power source voltage $V_{EE}$ on the semiconductor chip 50 are shown in FIG. 4A.

The interconnections 58 each occupy a small area and are scattered in the plan view in FIG. 4A. Hence, the signal interconnections may be provided between the interconnections 58 as indicated by arrows 59, and the signal interconnections may be designed with a large degree of freedom. The power source voltage $V_{EE}$ is supplied from the back surface of the semiconductor chip 50 at a position of the circuit which requires the power source voltage $V_{EE}$ in the plan view. In other words, the power source voltage $V_{EE}$ is supplied to the circuit in a vertical path in the cross sectional view. For this reason, it is possible to make the interconnection for supplying the power source voltage $V_{EE}$ extremely short. In addition, because the probability of a signal interconnection intersecting a power source interconnection is considerably reduced, it is possible to shorten the signal interconnection owing to the fact that there is less need to make a roundabout route to avoid intersecting the power source interconnection. As a result, it is possible to realize a high-speed circuit operation.

The resistivity of the conductive path in the semiconductor chip 50 from the metallized layer 42 to the first and second interconnections 31a and 32a through the $p^+$-type substrate 41, the $p^+$-type layer 44 and the $p^+$-type isolation layer 24a can be appropriately selected by changing the cross sectional area and/or the density of the p-type impurity of the conductive path and/or the thickness of the p-type layer 43.

For example, when a cross sectional area s of the conductive path is 100 $\mu m^2$, a length L of the conductive path is 5 microns and a resistivity $\rho$ of the conductor path is 0.01 $\Omega cm$, a resistance R of the conductive path becomes $R = \rho(L/s) = 5\Omega$. In this case, the voltage drop due to a current of 1 mA is 5 mV. In addition, when the $p^+$-type substrate 41 has a size of 5 mm by 5 mm and a thickness t of 0.5 mm and a resistivity of 0.01 $\Omega cm$, a voltage drop V for the case where a current I of 1 A flows in total may be described by $V = RI = \rho(t/s)I$. Hence, this voltage drop V is approximately 2 mV. Therefore, a total voltage drop is approximately 7 mV which is considerably small compared to the conventional case where the total voltage drop would be 50 mV or more.

The connection of the semiconductor chip 50 to the package 51 is made by die-bonding the semiconductor chip 50 on the stage 52. Thus, the power source voltage $V_{EE}$ can be stably supplied to the semiconductor chip 50 without wire-bonding.

The problem of electromigration will not occur because the length of the metal interconnection (first and second interconnections 31a and 32a) for the power source voltage $V_{EE}$ can be made short and the current density can be made small.

It is possible to realize a large scale integrated (LSI) circuit having a higher density because the number of power source interconnections extending horizontally are reduced. Furthermore, the reliability of the semiconductor integrated circuit is improved because of the reduced number of levels of interconnections.

Since the $p^+$-type substrate 41 has the high impurity density, it is possible to prevent the p-type substrate from being transformed into an n-type due to oxygen and carbon which are included in the silicon substrate produced by the Czochralski method and act as impurity donors. In addition, because the p-type layer 43 having the low impurity density makes contact with the n-type epitaxial layer 23a, a pn junction capacitance thereof can be made small.

Figure 5:
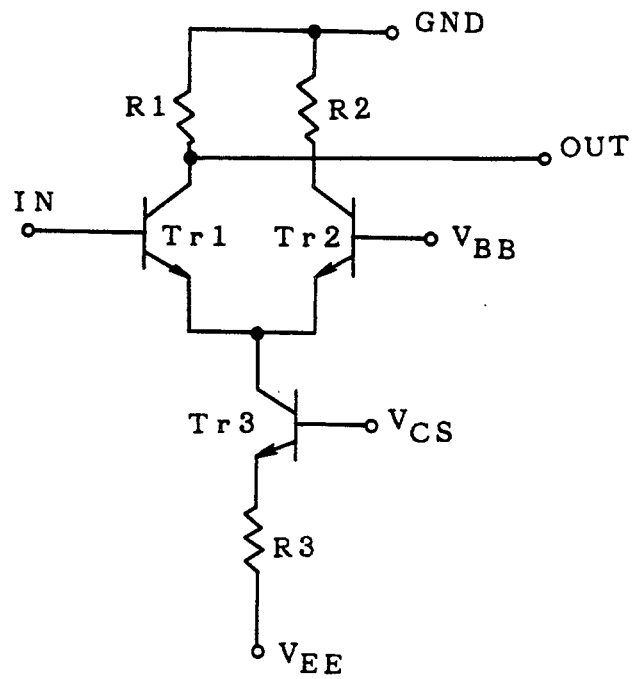
FIG. 5 is a circuit diagram showing an ECL circuit within the semiconductor chip shown in FIGS. 4A and 4B.

FIG. 5 is a circuit diagram showing an ECL circuit within the semiconductor chip 50. In FIG. 5, transistors Tr1, Tr2 and Tr3 and resistors R1, R2 and R3 are connected as shown. $V_{EE}$ denotes a power source voltage, $V_{BB}$ and $V_{CS}$ denote reference voltages, GND denotes the ground voltage, IN denotes an input of the ECL circuit, and OUT denotes an output of the ECL circuit.

Figure 6:
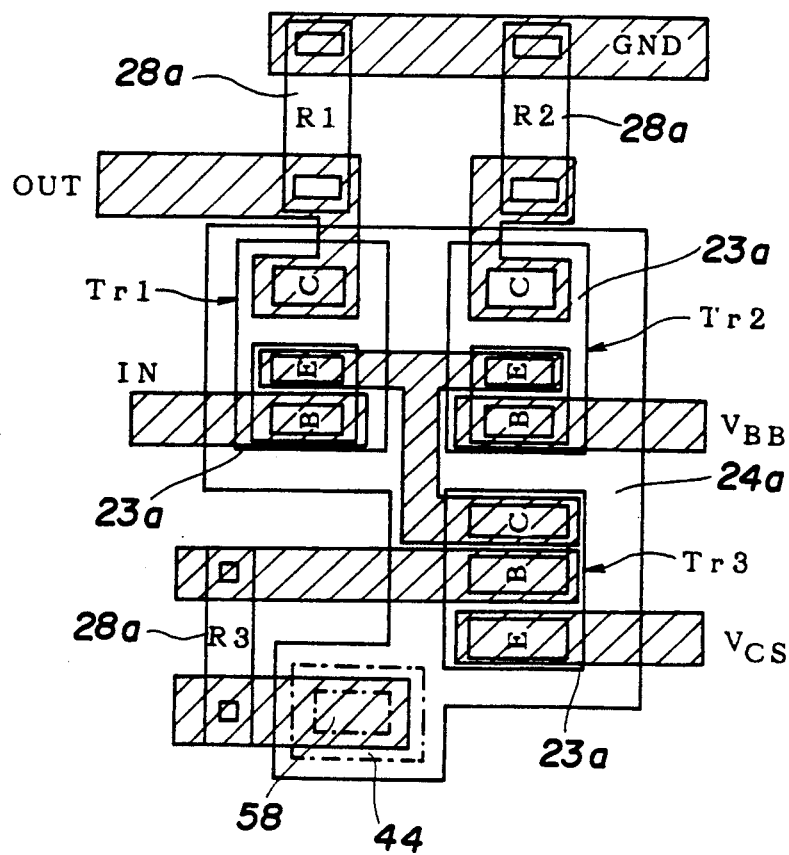
FIG. 6 is a plan view on an enlarged scale showing interconnections for realizing the ECL circuit shown in FIG. 5 on the first embodiment of the semiconductor integrated circuit.

FIG. 6 shows on an enlarged scale a plan view of the interconnections for realizing the ECL circuit shown in FIG. 5 on the first embodiment of the semiconductor integrated circuit. In FIG. 6, those parts which are the same as those corresponding parts in FIGS. 3, 4A, 4B and 5 are designated by the same reference numerals, and a description thereof will be omitted. In FIG. 6, the interconnections are shown with hatchings. B, E and C respectively denote the base, emitter and collector of the transistors Tr1 through Tr3. It is of course possible to connect a terminal of the resistor R3 to be coupled to the power source voltage $V_{EE}$ directly to the $p^+$-type isolation layer 24a instead of through a metal interconnection (58).

Figure 7:
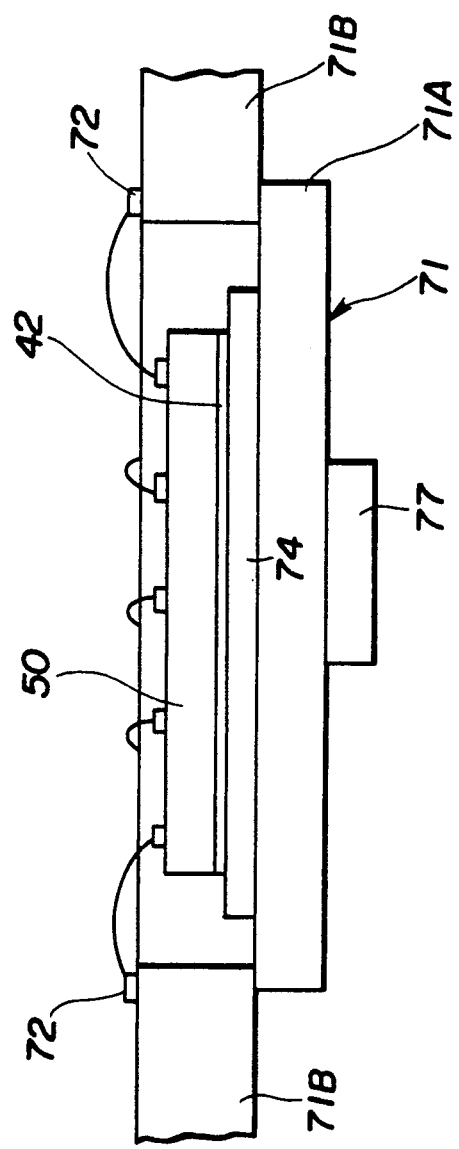
FIG. 7 is a cross sectional view showing a modification of the first embodiment of the semiconductor integrated circuit.

FIG. 7 is a cross sectional view showing a modification of the first embodiment of the semiconductor integrated circuit according to the present invention. In FIG. 7, those parts which are essentially the same as those corresponding parts in FIG. 4B are designated by the same reference numerals, and a description thereof will be omitted. In FIG. 7, a package 71 has a copper (Cu) portion 71A and a ceramic portion 71B. A molybdenum (Mo) interconnection 74 is provided on the Cu portion 71A. Package leads 72 are formed on the ceramic portion 71B, and terminals for signal input and output and terminals for supplying the power source voltage $V_{CC}$ respectively provided on the semiconductor chip 50 are connected to the package leads 72 by a wire-bonding or other methods. The semiconductor chip 50 is mounted on the package 71 so that the metallized layer 42 makes contact with the Mo interconnection 74. An electrode 77 is provided on the Cu portion 71A, and the power source voltage $V_{EE}$ is supplied from the electrode 77.

Figure 8:
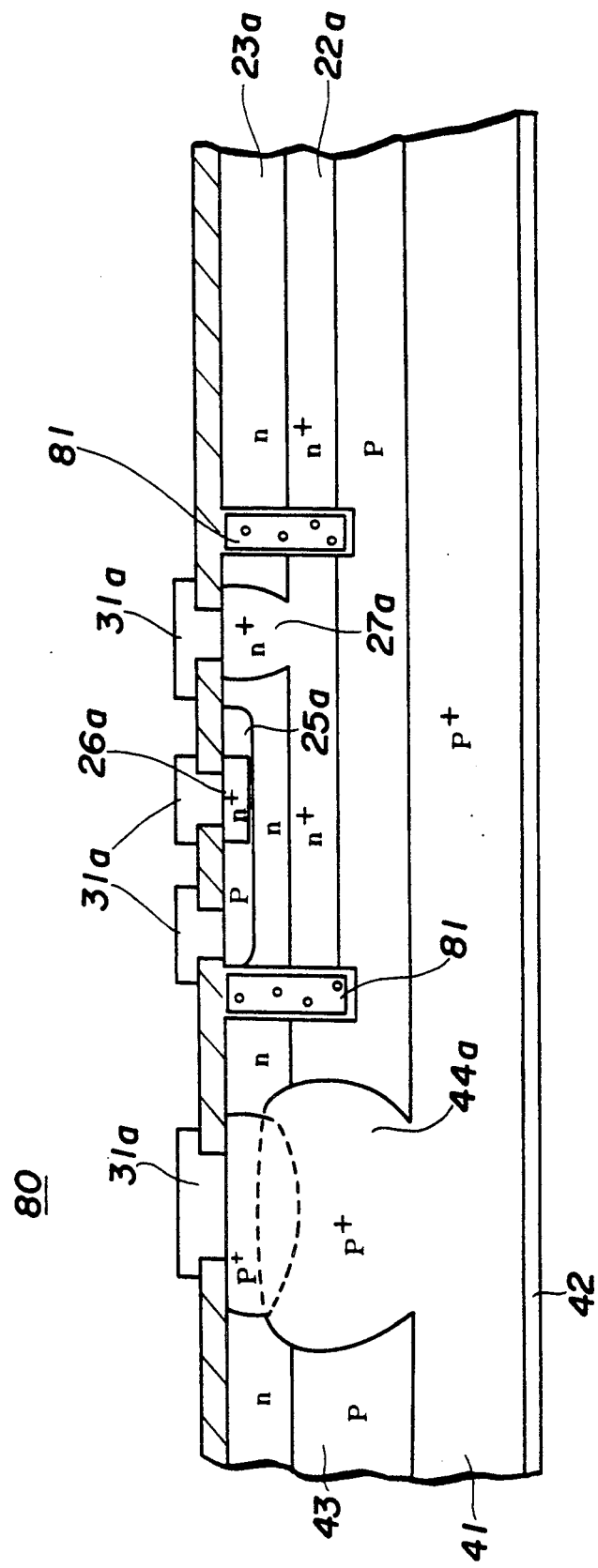
FIG. 8 is a cross sectional view showing a second embodiment of the semiconductor integrated circuit according to the present invention.

Next, a description will be given of a second embodiment of the semiconductor integrated circuit according to the present invention, by referring to a cross sectional view of a semiconductor chip of the second embodiment shown in FIG. 8. In FIG. 8, those parts which are essentially the same as those corresponding parts in FIG. 3 are designated by the same reference numerals, and a description thereof will be omitted.

In the first embodiment shown in FIG. 3, the $p^+$-type isolation layer 24a is used in common as an isolation layer for isolating a circuit element forming layer (23a) along the horizontal direction and as a portion of the conductive path for supplying the power source voltage $V_{EE}$. However, in the second embodiment, a trench isolation 81 is used to isolate the circuit element forming layer of a semiconductor chip 80 along the horizontal direction, and the conductive path is formed independently of the trench isolation 81. In other words, a $p^+$-type layer or region 44a is formed to extend from the n-type epitaxial layer 23a to the $p^+$-type substrate 41. Accordingly, the power source voltage $V_{EE}$ is supplied to the semiconductor chip 80 through the $p^+$-type substrate 41 and the $p^+$-type layer 44a. Finally, the power source voltage $V_{EE}$ obtained through these layers is supplied to the ECL circuit or the like within the semiconductor chip 80 through the first and second interconnections (not shown in FIG. 8).

Figure 9:
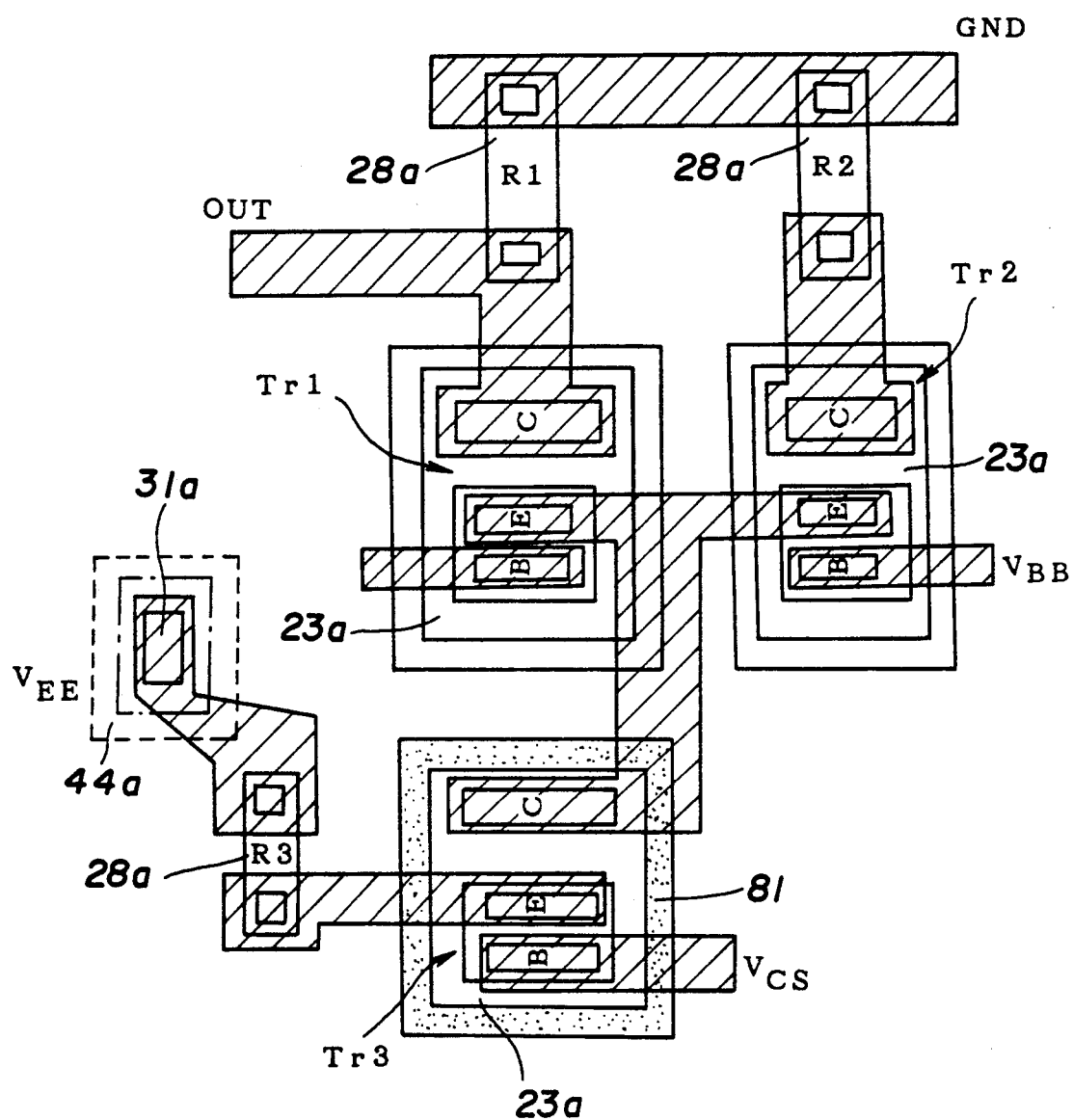
FIG. 9 is a plan view on an enlarged scale showing interconnections for realizing the ECL circuit shown in FIG. 5 on the second embodiment of the semiconductor integrated circuit.

FIG. 9 shows on an enlarged scale a plan view of the interconnections for realizing the ECL circuit shown in FIG. 5 on the second embodiment of the semiconductor integrated circuit. In FIG. 6, those parts which are the same as those corresponding parts in FIGS. 5 and 8 are designated by the same reference numerals, and a description thereof will be omitted. The interconnections are shown with hatchings.

According to the described embodiments, the power source voltage $V_{EE}$ is supplied from the back surface of the substrate. For this reason, there is no need to provide terminals for supplying the power source voltage $V_{EE}$ on top of the semiconductor chip and it is possible to provide that much more terminals (or pads) for signals on top of the semiconductor chip without increasing the chip size.

Figure 10:
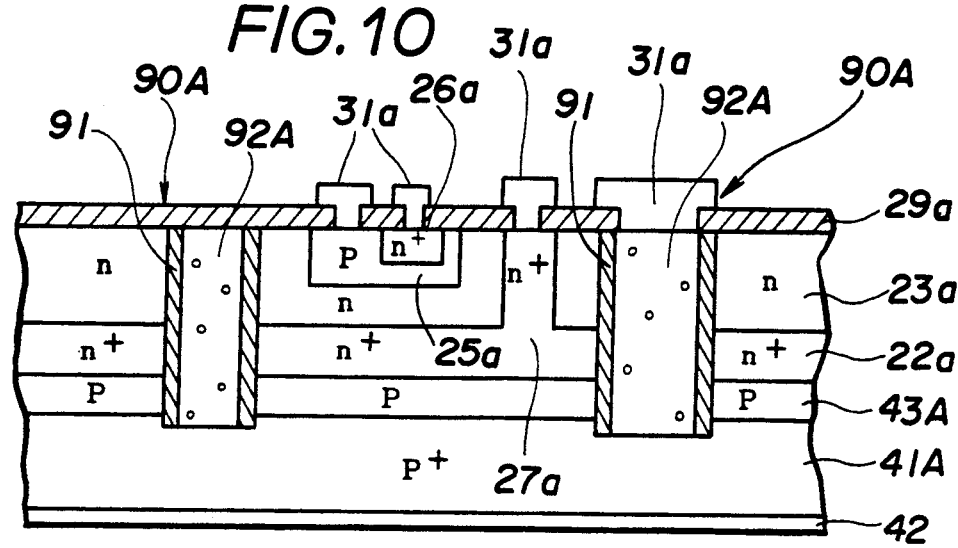
FIG. 10 is a cross sectional view showing a third embodiment of the semiconductor integrated circuit according to the present invention.
Figure 11:
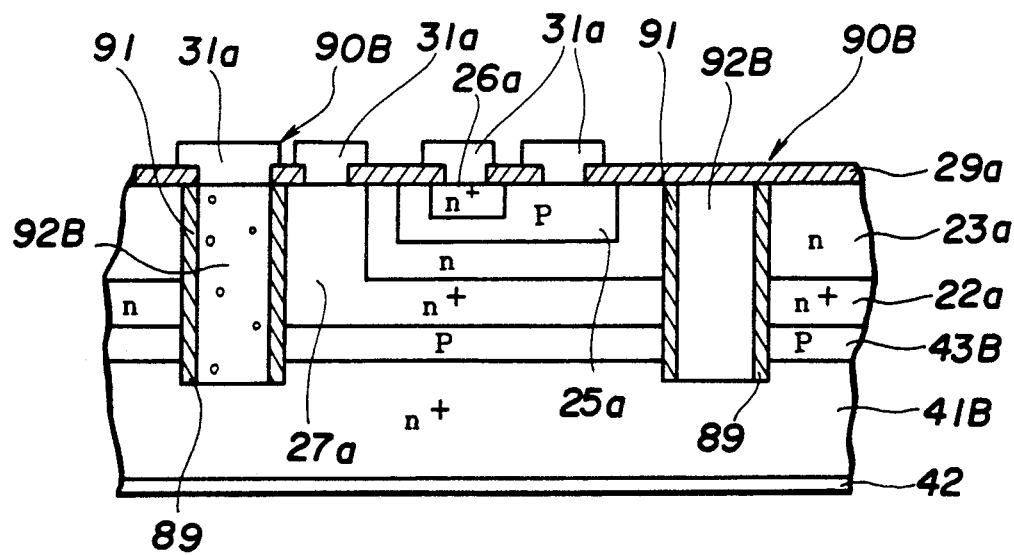
FIG. 11 is a cross sectional view showing a modification of the third embodiment.

FIG. 10 shows a third embodiment of the semiconductor integrated circuit according to the present invention, and FIG. 11 shows a modification of the third embodiment. In FIGS. 10 and 11, those parts which are essentially the same as those corresponding parts in FIG. 8 are designated by the same reference numerals, and a description thereof will be omitted.

The third embodiment and the modification thereof employ a trench connecting means 90A similar to the trench isolation 81, as a means for connecting the circuit element forming layer to a p+-type substrate 41A or a n+-type substrate 41B. In the third embodiment shown in FIG. 10, a silicon oxide layer 91 is formed on only side surfaces of U-grooves 89 which extend into the p+-type substrate 41A, and the inside of the U-grooves 89 is filled by a conductive filler material 92A such as a p-type polysilicon and a metal such as tungsten (W). The U-grooves 89 have an approximate U-shape. In the modification shown in FIG. 11, a trench connecting means 90B similar to that of the third embodiment is formed on the n+-type substrate 41B. But in the case of the modification shown in FIG. 11, a conductive filler material 92B is an n-type polysilicon or a metal such as W.

In the third embodiment shown in FIG. 10, a most negative power source voltage (for example, $V_{EE}$ or the like) is connected to the substrate 41A because the p-type polysilicon or the metal fills the U-grooves 89 of the trench connecting means 90A. In this case, a most positive power source voltage is supplied to the circuit element forming layer through the power source interconnection (for example, Al interconnection and not shown) provided on the top side of the semiconductor integrated circuit. On the other hand, in the modification shown in FIG. 11, a most positive power source voltage (for example, GND) is connected to the substrate 41B because the n-type polysilicon or the metal fills the U-grooves 89 of the trench connecting means 90B. In this case, a most negative power source voltage is supplied to the circuit element forming layer through the power source interconnection (not shown) provided on the top side of the semiconductor integrated circuit.

Figure 12:
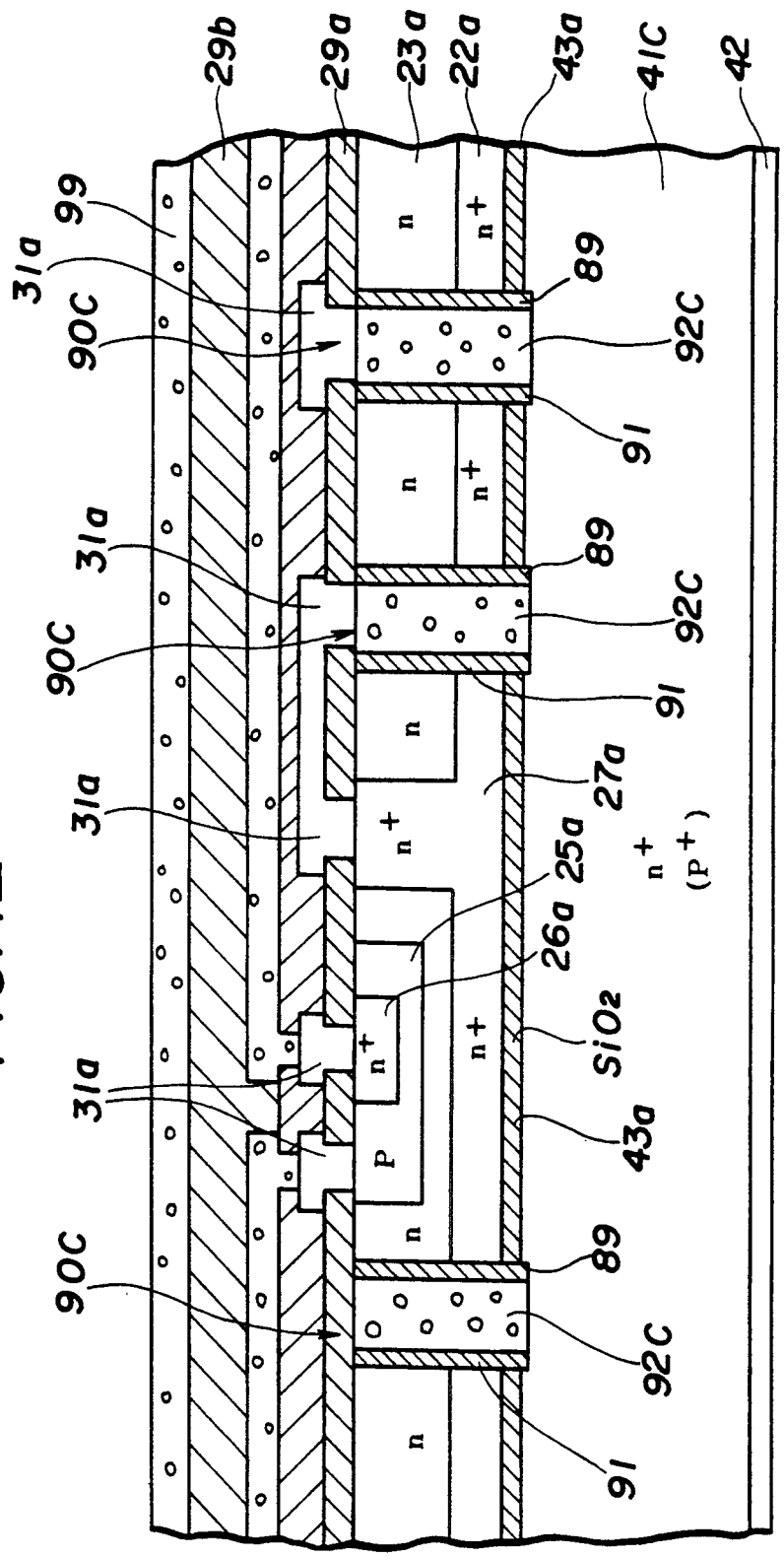
FIG. 12 is a cross sectional view showing a fourth embodiment of the semiconductor integrated circuit according to the present invention.

FIG. 12 shows a fourth embodiment of the semiconductor integrated circuit according to the present invention. In FIG. 12, those parts which are essentially the same as those corresponding parts in FIGS. 10 and 11 are designated by the same reference numerals, and a description thereof will be omitted. In this fourth embodiment, an insulator layer 43a made of SiO2 or the like is formed between a substrate 41C and the n+-type buried layer 22a which is connected to the n+-type diffusion layer 27a which becomes the collector so as to further reduce the parasitic capacitance between the substrate 41C and the n+-type buried layer 22a. In other words, the insulator layer 43a is interposed between the low resistivity substrate 41C which may be a p-type or an n-type substrate and the circuit element forming layer including the n+-type buried layer 22a and the n-type epitaxial layer 23a, and trench connecting means 90C are formed similarly as in the third embodiment (and modification thereof) as shown in FIG. 12.

In FIG. 12, the silicon oxide layer 91 is formed on only side surfaces of the U-grooves 89 which penetrate the insulator layer 43a and extend into the substrate 41C, and the inside of the U-grooves 89 is filled by a conductive filler material 92C such as a p-type or an n-type polysilicon and a metal such as tungsten (W). The p-type or n-type polysilicon is used as the conductive filler material 92C depending on whether the substrate 41C is p-type or n-type. An insulator layer 29b is formed on the second interconnection 32a, and a third interconnection 99 is formed on the insulator layer 29b. According to this embodiment, it is possible to minimize the parasitic capacitance between the substrate 41 and the collector region.

In the described embodiments, the power source voltages $V_{EE}$ and $V_{CC}$ are used because the description is given of the case where ECL circuits are formed in the semiconductor chip. Hence, the power source voltage $V_{CC}$ is the ground voltage GND and the power source voltage $V_{EE}$ is $-5.2$ V, for example. But when transistor transistor logic (TTL) circuits are formed in the semiconductor chip, the power source voltage $V_{EE}$ supplied from the back surface of the substrate is the ground voltage GND and the power source voltage supplied from the front surface is $V_{CC}=5.0$ V, for example. In other words, a lowest power source voltage is supplied from the back surface of the substrate.

Moreover, a p-type substrate is used in the described embodiments, but it is of course possible to use an n-type substrate. In this case, however, a highest power source voltage is supplied from the back surface of the substrate.

Further, the present invention is not limited to these embodiments, but various variations and modifications may be made without departing from the scope of the present invention.

What is claimed is:

1. A semiconductor integrated circuit comprising:
   a substrate of a first semiconductor type having front and back surfaces and including a first impurity density, said first semiconductor type being one of a p-type semiconductor and an n-type semiconductor;
   a conductive layer formed on the back surface of said substrate;
   a first layer of the first semiconductor type formed on the front surface of said substrate, said first layer having a second impurity density lower than the first impurity density;
   a second layer of a second semiconductor type formed on said first layer for forming circuit elements therein, said second semiconductor type being the other one of said p-type semiconductor and said n-type semiconductor; and
   a region extending from a top surface of said second layer and reaching said substrate,
   said conductive layer and said region forming a conductive path for supplying a power source voltage to the circuit elements in said second layer from the back surface of said substrate to thereby shorten power source interconnection to said circuit elements.

2. A semiconductor integrated circuit as claimed in claim 1 in which said region is made up of a groove, an oxide layer formed on side surfaces of the groove, and a conductive filler material filling the groove, said groove reaching said substrate.

3. A semiconductor integrated circuit as claimed in claim 2 in which said groove has an approximate U-shape, said conductive filler material being made of a polysilicon of the first semiconductor type.

4. A semiconductor integrated circuit as claimed in claim 2 in which said groove has an approximate U-shape, said conductive filler material being made of a metal.

5. A semiconductor integrated circuit comprising:
a substrate of a first semiconductor type having front and back surfaces and including a first impurity density, said first semiconductor type being one of a p-type semiconductor and an n-type semiconductor;
a conductive layer formed on the back surface of said substrate;
a first layer of a second semiconductor type formed on the front surface of said substrate, said first layer having a second impurity density lower than the first impurity density, said second semiconductor type being the other one of said p-type semiconductor and said n-type semiconductor;
a second layer of the first semiconductor type formed on said first layer for forming circuit elements therein; and
a region extending from a top surface of said second layer and reaching said substrate,
said conductive layer and said region forming a conductive path for supplying a power source voltage to the circuit elements in said second layer from the back surface of said substrate to thereby shorten power source interconnection to said circuit elements.

6. A semiconductor integrated circuit as claimed in claim 5 in which said region is made up of a groove, an oxide layer formed on side surfaces of the groove, and a conductive filler material filling the groove, said groove reaching said substrate.

7. A semiconductor integrated circuit as claimed in claim 6 in which said groove has an approximate U-shape, said conductive filler material being made of a polysilicon of the first semiconductor type.

8. A semiconductor integrated circuit as claimed in claim 6 in which said groove has an approximate U-shape, said conductive filler material being made of a metal.

9. A semiconductor integrated circuit comprising:
a substrate of a first semiconductor type having front and back surfaces, said first semiconductor type being one of a p-type semiconductor and an n-type semiconductor;
a conductive layer formed on the back surface of said substrate;
an insulator layer formed on the front surface of said substrate;
an element forming layer of the first semiconductor type formed on said insulator layer for forming circuit elements therein; and
a region extending from a top surface of said element forming layer and reaching at least said substrate, said region being comprised of a conductive filler material,
said conductive layer and said region forming conductive path for supplying a power source voltage to the circuit elements in said element forming layer from the back surface of said substrate to thereby shorten power source interconnection to said interconnection to said circuit elements.

10. A semiconductor integrated circuit as claimed in claim 9, wherein said region comprises a groove, an oxide layer formed on side surfaces of the groove, and said conductive filler material filling the groove, said groove reaching said substrate.

11. A semiconductor integrated circuit as claimed in claim 10 in which said groove has an approximate U-shape, said conductive filler material being made of a polysilicon of the first semiconductor type.

12. A semiconductor integrated circuit as claimed in claim 10 in which said groove has an approximate U-shape, said conductive filler material being made of a metal.

13. A semiconductor integrated circuit comprising:
a substrate of a first semiconductor type having front and back surfaces, said first semiconductor type being one of a p-type semiconductor and an n-type semiconductor;
a conductive layer formed on a back surface of said substrate;
an insulator layer formed on a front surface of said substrate;
an element forming layer of a second semiconductor type formed on said insulator layer for forming circuit elements therein, said second semiconductor type being the other one of said p-type semiconductor and said n-type semiconductor; and
a region extending from a top surface of said element forming layer and reaching at least said substrate, said region being comprised of a conductive filler material,
said conductive layer and said region forming a conductive path for supplying a power source voltage to the circuit elements in said element forming layer from the back surface of said substrate to thereby shorten power source interconnection to said circuit elements.

14. A semiconductor integrated circuit as claimed in claim 13, wherein said region comprises a groove, an oxide layer formed on side surfaces of the groove, and said conductive filler material filling the groove, said groove reaching said substrate.

15. A semiconductor integrated circuit as claimed in claim 14 in which said groove has an approximate U-shape, said conductive filler material being made of a polysilicon of the first semiconductor type 16. A semiconductor integrated circuit as claimed in claim 14 in which said groove has an approximate U-shape, said conductive filler material being made of a metal.

* * * * *